US012575257B2

(12) United States Patent
Kim et al.

(10) Patent No.: US 12,575,257 B2
(45) Date of Patent: Mar. 10, 2026

(54) TRANSPARENT DISPLAY APPARATUS

(71) Applicant: LG Display Co., Ltd., Seoul (KR)

(72) Inventors: Wonrae Kim, Paju-si (KR); Jungmin Yoon, Paju-si (KR); SeungBum Lee, Paju-si (KR); Seungcheol You, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 682 days.

(21) Appl. No.: 17/984,142

(22) Filed: Nov. 9, 2022

(65) Prior Publication Data

US 2023/0189604 A1 Jun. 15, 2023

(30) Foreign Application Priority Data

Dec. 13, 2021 (KR) ........................ 10-2021-0177812

(51) Int. Cl.
| | |
|---|---|
| *H01L 31/12* | (2006.01) |
| *H10K 50/856* | (2023.01) |
| *H10K 50/858* | (2023.01) |
| *H10K 59/35* | (2023.01) |

(52) U.S. Cl.
CPC ......... *H10K 50/856* (2023.02); *H10K 50/858* (2023.02); *H10K 59/353* (2023.02)

(58) Field of Classification Search
CPC ...... H10K 59/353; H10K 59/35; H10K 59/38; H10K 59/00–95; H10K 50/856; H10K 50/858; H10K 50/852; H10K 50/00–88; G02F 1/133555; G02F 1/1677
See application file for complete search history.

(56) References Cited

U.S. PATENT DOCUMENTS

| | | | |
|---|---|---|---|
| 7,714,964 B2 | 5/2010 | Kim et al. | |
| 9,140,936 B2 | 9/2015 | Xie | |
| 11,442,210 B2 | 9/2022 | Lin et al. | |
| 11,737,324 B2 | 8/2023 | Shin et al. | |
| 2003/0076464 A1 | 4/2003 | Ozawa et al. | |
| 2003/0107688 A1 | 6/2003 | Yamagishi | |
| 2008/0273130 A1 | 11/2008 | Tung et al. | |
| 2016/0327853 A1 | 11/2016 | Sarma et al. | |
| 2020/0303683 A1* | 9/2020 | Sano .................... | H10K 59/126 |
| 2021/0111235 A1* | 4/2021 | Ichikawa ......... | H10K 59/80518 |
| 2024/0055435 A1* | 2/2024 | Li ........................ | H10K 59/131 |
| 2024/0057370 A1* | 2/2024 | Kato ..................... | H10K 59/35 |

FOREIGN PATENT DOCUMENTS

| | | |
|---|---|---|
| CN | 1406343 A | 3/2003 |
| CN | 1982995 A | 6/2007 |
| CN | 102789101 A | 11/2012 |
| CN | 106125486 A | 11/2016 |

(Continued)

*Primary Examiner* — Steven B Gauthier
*Assistant Examiner* — Rhys Poniente Sheker
(74) *Attorney, Agent, or Firm* — Seed Intellectual Property Law Group LLP

(57) ABSTRACT

A transparent display apparatus is provided, which may improve visibility of an image with respect to external light. The transparent display apparatus comprises a substrate including a plurality of pixels, each of which has a light emission area and a transmissive area, and a reproducing plate disposed in parallel with the substrate, wherein the reproducing plate includes a plurality of reproducing portions at least partially overlapped with the transmissive area.

24 Claims, 9 Drawing Sheets

(56)          References Cited

FOREIGN PATENT DOCUMENTS

| | | | |
|---|---|---|---|
| CN | 108254954 | A | 7/2018 |
| CN | 112162345 | A | 1/2021 |
| CN | 112992925 | A | 6/2021 |
| KR | 20150082014 | A | 7/2015 |
| KR | 10-2016-0131919 | A | 11/2016 |

* cited by examiner

TRANSPARENT DISPLAY APPARATUS

CROSS-REFERENCE TO RELATED APPLICATIONS

This application claims the benefit of the Korean Patent Application No. 10-2021-0177812 filed on Dec. 13, 2021, which is hereby incorporated by reference as if fully set forth herein.

BACKGROUND

Technical Field

The present disclosure relates to a transparent display apparatus.

Description of the Related Art

With the advancement of the information age, the demand for a display apparatus for displaying an image has increased in various forms. Therefore, various types of display apparatuses such as a liquid crystal display (LCD) apparatus, a plasma display panel (PDP) apparatus, an organic light emitting display (OLED) apparatus and a quantum dot light emitting display (QLED) apparatus have been recently used.

Recently, studies for a transparent display apparatus in which a user may view objects or images positioned at an opposite side by transmitting the display apparatus are actively ongoing. The transparent display apparatus includes a display unit on which an image is displayed and a non-display unit that includes a bezel area, wherein the display unit may include a transmissive area capable of transmitting external light and a non-transmissive area having a light emission area.

BRIEF SUMMARY

Meanwhile, a user located on a front surface of a transparent display apparatus may view an image through light emitted from the light emission area of the transparent display apparatus. However, when external light is illuminated from a rear surface of the transparent display apparatus to a front surface thereof, since the external light is transmitted through the transmissive area, the user located on the front surface has a problem in that visibility of an image is deteriorated due to the external light. Therefore, although a method such as spreading a black film to prevent external light from being incident on the transparent display apparatus has been devised, it takes a considerable time to shield external light and does not shield 100% of the external light, whereby a problem occurs in that the effect of improving visibility of the image is insignificant.

One or more embodiments of the present disclosure addresses the short comings of the related art including the above problems identified by the inventors.

One or more embodiments of the present disclosure provide a transparent display apparatus that may improve visibility of an image with respect to external light by improving luminance.

In addition to the technical benefits of the present disclosure as mentioned above, additional benefits and features of the present disclosure will be clearly understood by those skilled in the art from the following description of the present disclosure.

In accordance with an aspect of the present disclosure, the above and other objects can be accomplished by the provision of a transparent display apparatus comprising a substrate including a plurality of pixels, each of which has a light emission area and a transmissive area, and a reproducing plate disposed in parallel with the substrate, wherein the reproducing plate includes a plurality of reproducing portions at least partially overlapped with the transmissive area.

In accordance with another aspect of the present disclosure, the above and other objects can be accomplished by the provision of a transparent display apparatus comprising a substrate including a plurality of pixels, each of which has a light emission area and a transmissive area, and a reproducing plate reflecting light emitted from the light emission area and incident through the transmissive area, wherein the reproducing plate includes a plurality of first reproducing members reflecting red light incident through the transmissive area, a plurality of second reproducing members reflecting green light incident through the transmissive area, and a plurality of third reproducing members reflecting blue light incident through the transmissive area, and the plurality of first reproducing members, the plurality of second reproducing members and the plurality of third reproducing members are alternately disposed.

BRIEF DESCRIPTION OF THE SEVERAL VIEWS OF THE DRAWINGS

The above and other objects, features and other advantages of the present disclosure will be more clearly understood from the following detailed description taken in conjunction with the accompanying drawings, in which.

DETAILED DESCRIPTION

Figure 1:
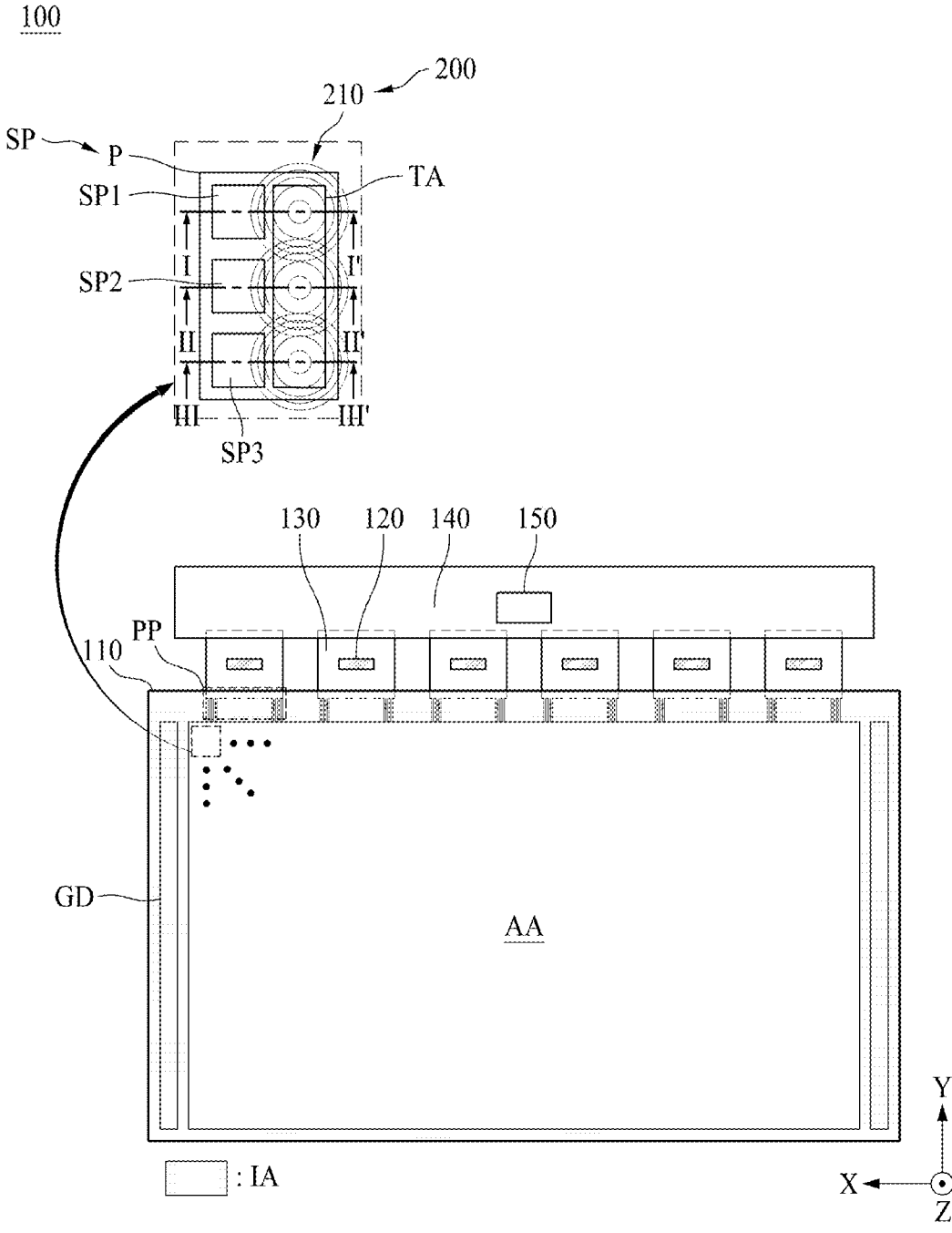
FIG. 1 is a perspective view illustrating a transparent display apparatus according to one embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings.

The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~,' 'over~,' 'under~,' and 'next~,' one or more other parts may be disposed between the two parts unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

"X-axis direction," "Y-axis direction" and "Z-axis direction" should not be construed by a geometric relation only of a mutual vertical relation and may have broader directionality within the range that elements of the present disclosure may act functionally.

The term "at least one" should be understood as including any and all combinations of one or more of the associated listed items. For example, the meaning of "at least one of a first item, a second item and a third item" denotes the combination of all items proposed from two or more of the first item, the second item and the third item as well as the first item, the second item or the third item.

Features of various embodiments of the present disclosure may be partially or overall coupled to or combined with each other and may be variously inter-operated with each other and driven technically as those skilled in the art can sufficiently understand. The embodiments of the present disclosure may be carried out independently from each other or may be carried out together in co-dependent relationship.

Hereinafter, one or more embodiments of the present disclosure will be described in detail with reference to the accompanying drawings.

Figure 2:
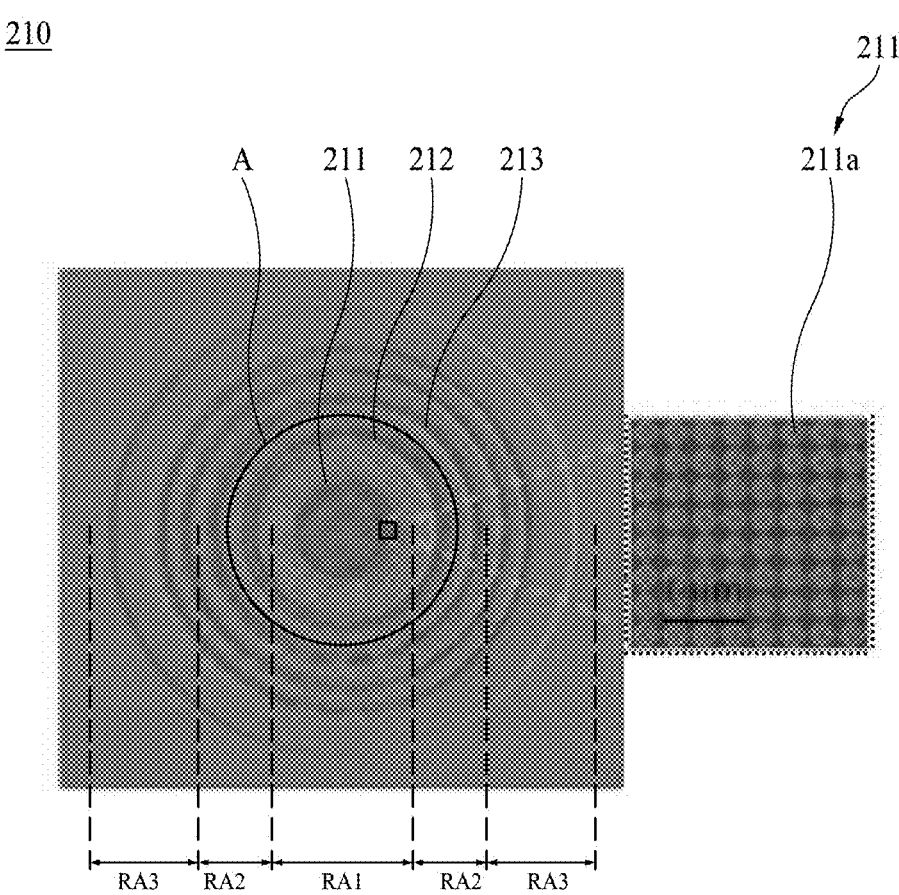
FIG. 2 is a plan photograph illustrating a plurality of reproducing portions of FIG. 1.
Figure 3:
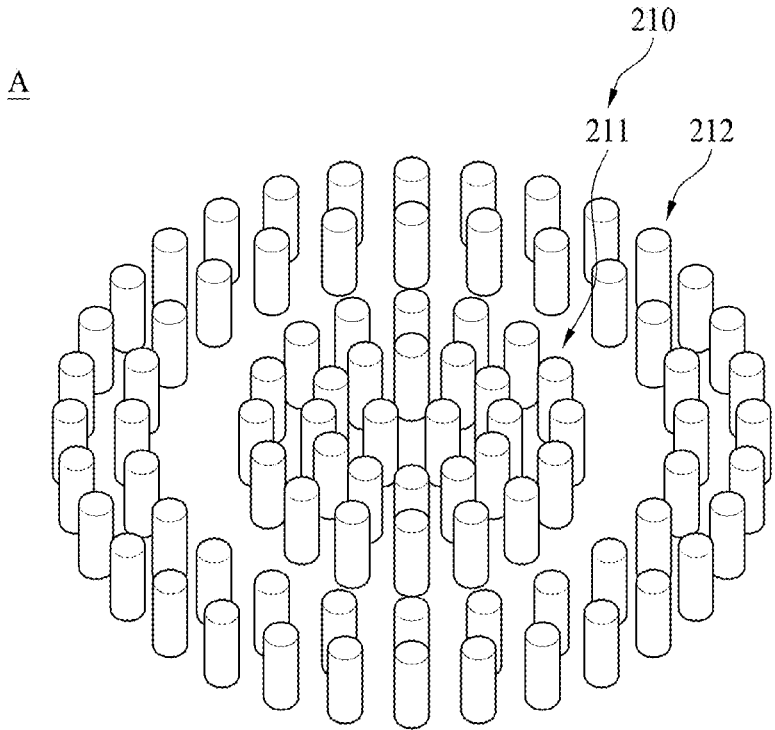
FIG. 3 is a schematic enlarged perspective view illustrating an area A of FIG. 2.
Figure 4:
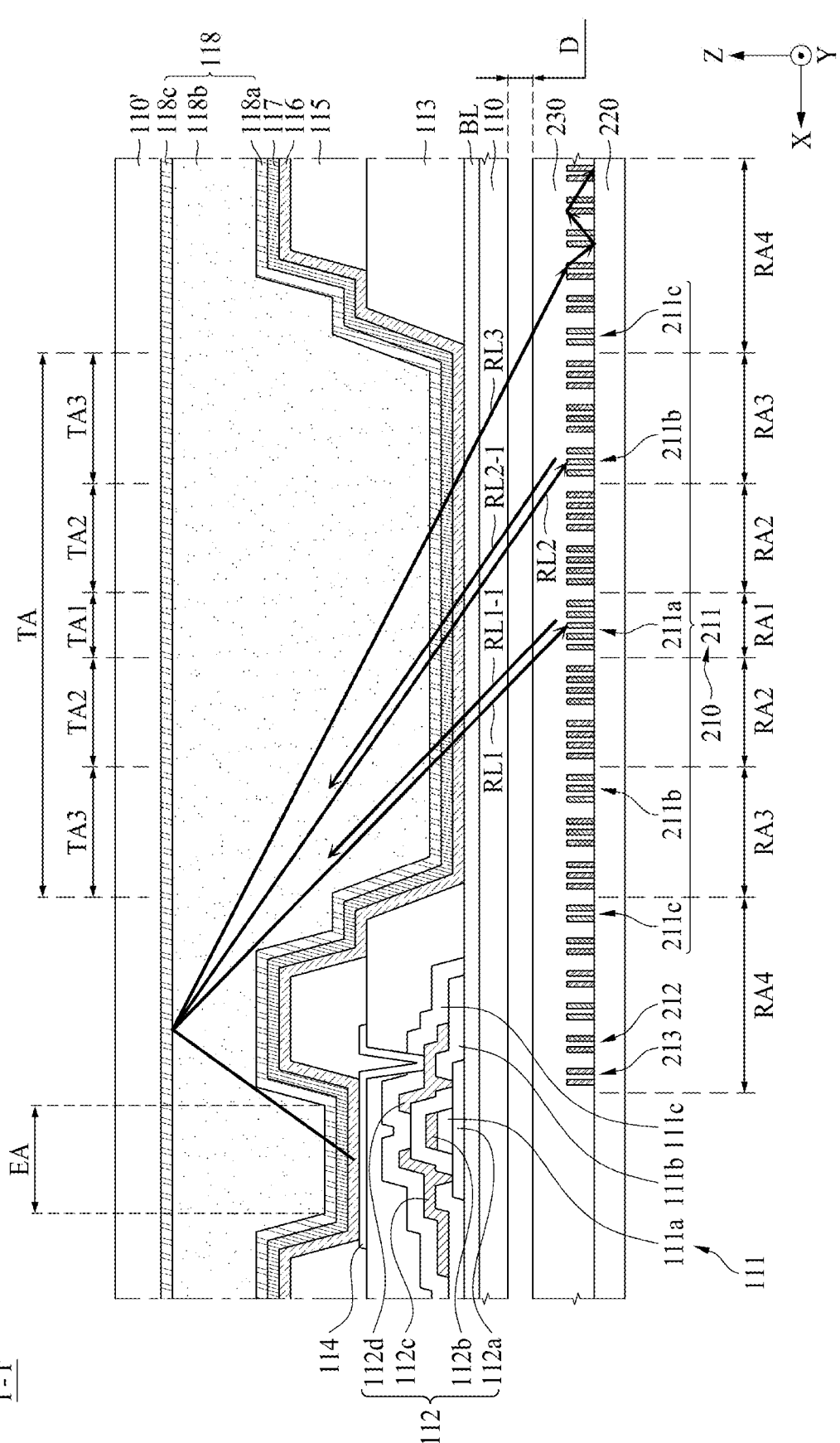
FIG. 4 is a schematic cross-sectional view taken along line I-I' shown in FIG. 1, illustrating an optical path of a first reproducing member.
Figure 5:
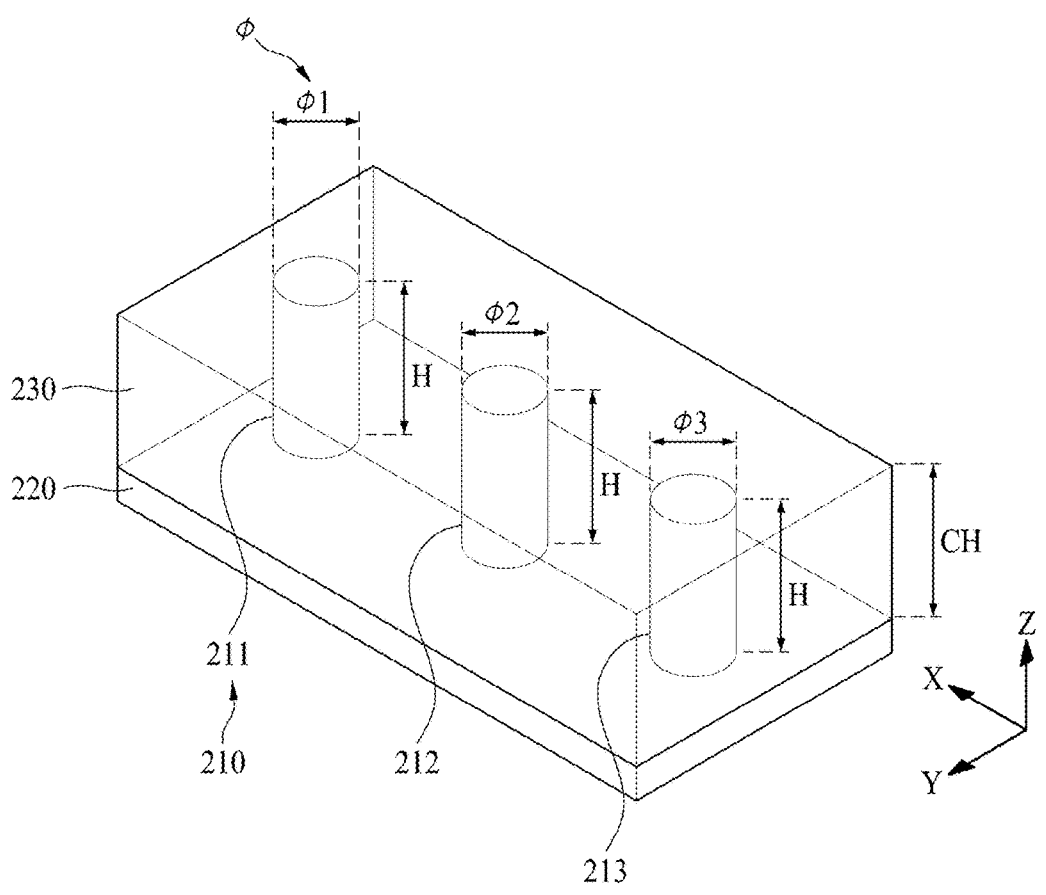
FIG. 5 is a schematic perspective view illustrating a reproducing plate of FIG. 4.
Figure 6:
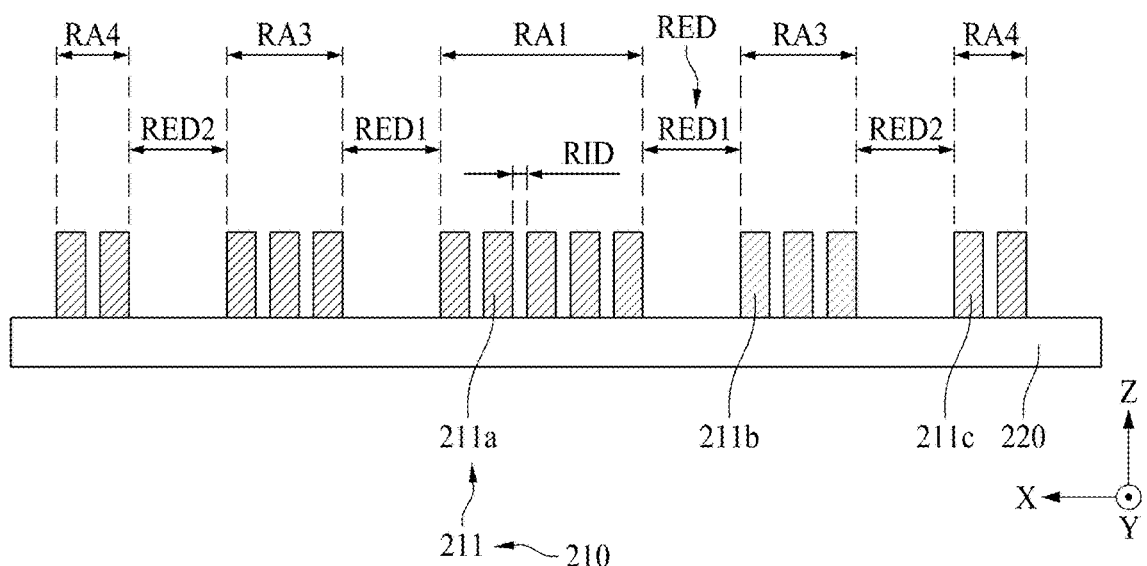
FIG. 6 is a schematic cross-sectional view illustrating a first sub-reproducing member, a second sub-reproducing member and a third sub-reproducing member of a first reproducing member of FIG. 4.
Figure 7:
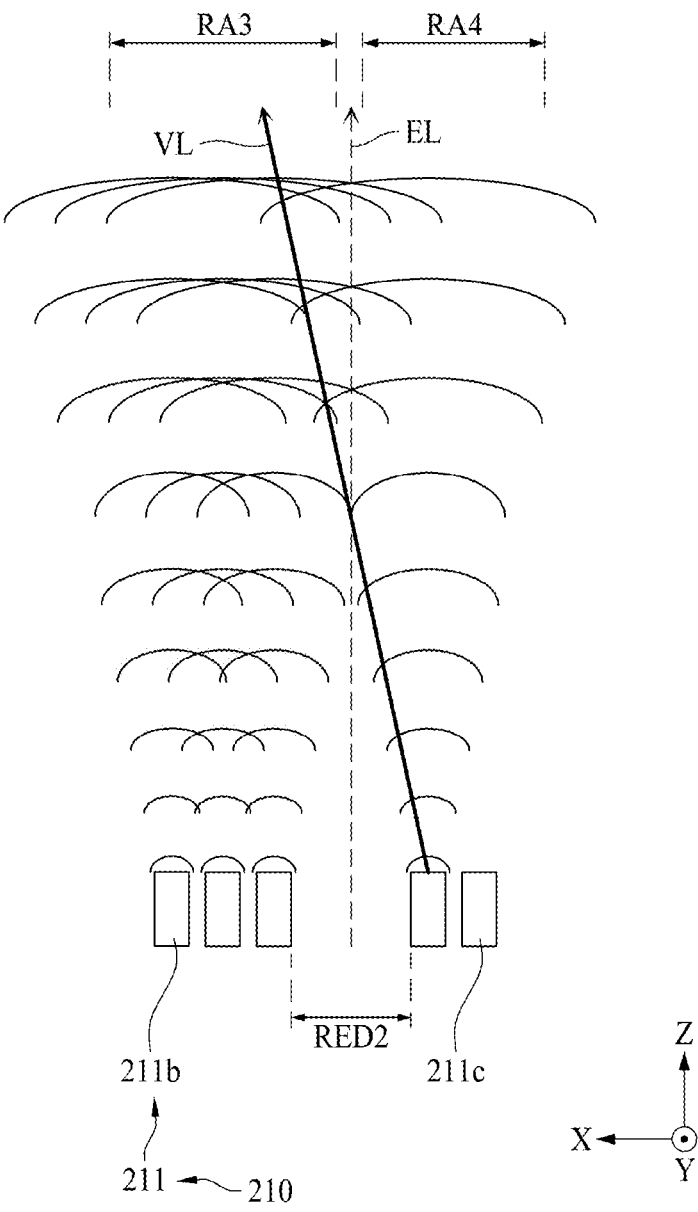
FIG. 7 is a schematic cross-sectional view illustrating diffraction by a reproducing member disposed in a third reproducing area and a fourth reproducing area of FIG. 4.
Figure 8:
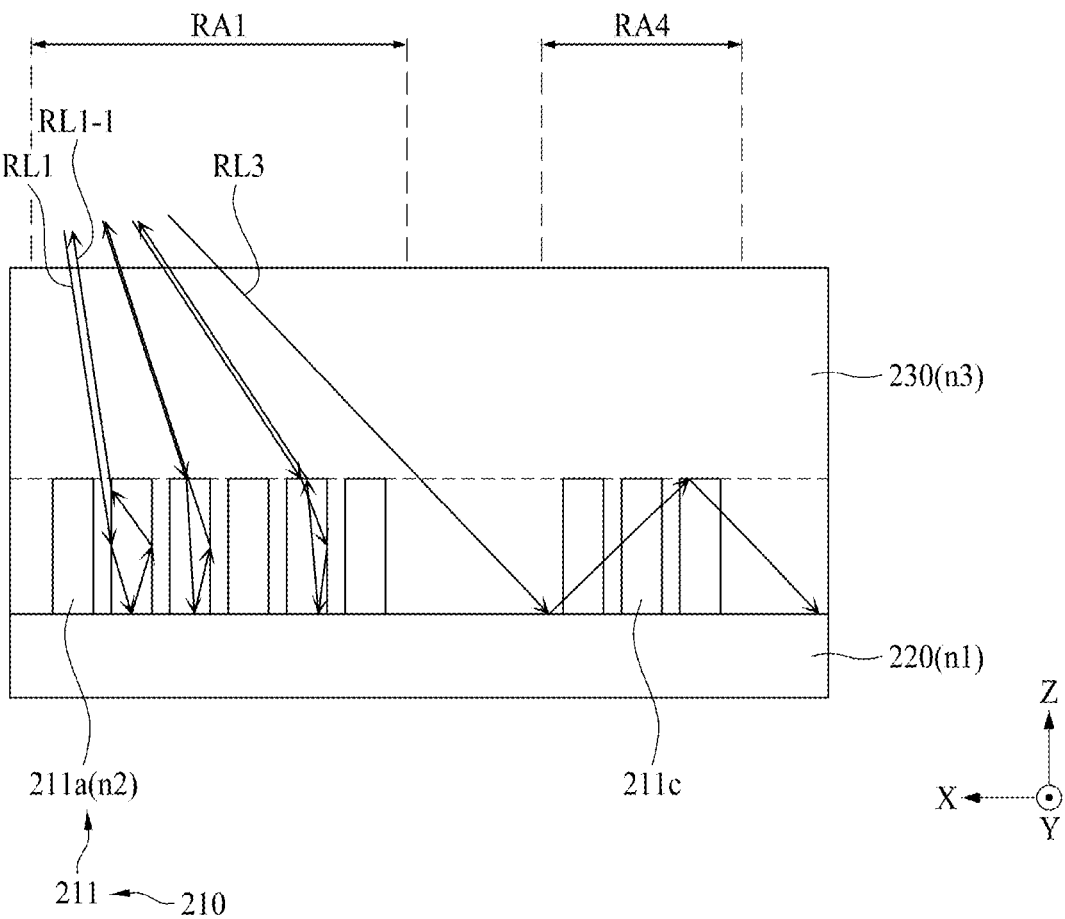
FIG. 8 is a schematic view illustrating an optical path of a first reproducing area and a fourth reproducing area of FIG. 4.

FIG. 1 is a perspective view illustrating a transparent display apparatus according to one embodiment of the present disclosure, FIG. 2 is a plan photograph illustrating a plurality of reproducing portions of FIG. 1, FIG. 3 is a schematic enlarged perspective view illustrating an area A of FIG. 2, FIG. 4 is a schematic cross-sectional view taken along line I-I' shown in FIG. 1, illustrating an optical path of a first reproducing member, FIG. 5 is a schematic perspective view illustrating a reproducing plate of FIG. 4, FIG. 6 is a schematic cross-sectional view illustrating a first sub-reproducing member, a second sub-reproducing member and a third sub-reproducing member of a first reproducing member of FIG. 4, FIG. 7 is a schematic cross-sectional view illustrating diffraction by a reproducing member disposed in a third reproducing area and a fourth reproducing area of FIG. 4, and FIG. 8 is a schematic view illustrating an optical path of a first reproducing area and a fourth reproducing area of FIG. 4.

Hereinafter, the following description will be based on that a transparent display apparatus 100 according to one embodiment of the present disclosure is an organic light emitting display apparatus, but is not limited thereto. That is, the transparent display apparatus according to one embodiment of the present disclosure may be implemented as any one of a liquid crystal display apparatus, a field emission display apparatus, a quantum dot lighting emitting diode apparatus, and an electrophoretic display apparatus as well as the organic light emitting display apparatus.

Referring to FIGS. 1 to 8, a transparent display apparatus 100 according to one embodiment of the present disclosure may include a display panel having a gate driver GD and a transmissive area TA, a source drive integrated circuit (hereinafter, referred to as "IC") 120, a flexible film 130, a circuit board 140, a timing controller 150, and a reproducing plate 200 disposed to be parallel with the display panel.

The display panel may include a substrate 110 and an opposite substrate 110' (shown in FIG. 4), which are bonded to each other.

The substrate 110 may include a thin film transistor, and may be a transistor array substrate, a lower substrate, or a first substrate. The substrate 110 may be a transparent glass substrate or a transparent plastic substrate. For example, the substrate 110 may be a transparent glass substrate. Hereinafter, the substrate 110 will be defined as a first substrate.

The opposite substrate 110' may be bonded to the first substrate 110. For example, the opposite substrate 110' may have a size smaller than that of the first substrate 110, and may be bonded to the remaining portion except the pad area PP of the first substrate 110. The opposite substrate 110' may be an upper substrate, a second substrate, or an encapsulation substrate. The opposite substrate 110' may be bonded to a first surface of the first substrate 110 by a substrate bonding process using an adhesive member (or transparent adhesive). Hereinafter, the opposite substrate 110' will be defined as a second substrate.

The first substrate 110 according to an example may include a display unit AA and a non-display unit IA.

The display unit AA is an area where an image is displayed, and may be a pixel array area, an active area, a pixel array unit, a display area, or a screen. For example, the display unit AA may be disposed at a central portion of the display panel DP.

The display unit AA according to one example may include gate lines, data lines, pixel driving power lines and a plurality of pixels P. Each of the plurality of pixels P may be defined by the gate lines and the data lines, and may include a plurality of subpixels SP including a light emission area EA for emitting light and the transmissive area TA disposed to be adjacent to some or all of the plurality of subpixels SP. The transmissive area TA is an area provided to allow light to pass through front and rear surfaces of the display panel. Therefore, a user located in a direction of the front surface of the display panel may view an image or background positioned in a direction of the rear surface of the display panel through the transmissive area TA.

However, when the external light is illuminated from the rear surface of the display panel, the external light may be transmitted to the front surface of the display panel through the transmissive area, so that visibility of the user, who is located in the direction of the front surface of the display panel, with respect to the image output from the display unit AA may be deteriorated. Therefore, the transparent display apparatus 100 according to one embodiment of the present disclosure may further include a reproducing plate 200 on the rear surface of the display panel (or substrate 110), thereby shielding the external light incident on the front surface of the display panel from the rear surface of the display panel to improve visibility of the image.

The reproducing plate 200 according to one example may include a plurality of reproducing portions 210 at least partially overlapped with the transmissive area TA. Each of the plurality of reproducing portions 210 may be provided in a cylindrical shape. The plurality of reproducing portions 210 are spaced apart from each other as much as a predetermined distance. The plurality of reproducing portions 210 may reflect light, which is emitted from the light emission area EA and incident on a first path (e.g., RL1) through the transmissive area TA, to a second path (e.g., RL1-1) opposite to the first path RL1. This may be achieved by a difference in a refractive index among the plurality of reproducing portions 210, a base substrate 220 positioned to be adjacent to the plurality of reproducing portions 210, and a cover layer 230 covering the base substrate 220 and the plurality of reproducing portions 210. Also, the light incident on the plurality of reproducing portions 210 through the transmissive area TA is diffracted by the adjacent reproducing portions 210, so that a path of light reflected through the constructive interference and destruction may be determined. As a result, the plurality of reproducing portions 210 may reflect image light, which is emitted from the light emission area EA through constructive interference and destruction generated by diffraction and incident on the first path through the transmissive area TA and the difference in the refractive index the base substrate 220 and the cover layer 230, to a position where the light is emitted, through the second path. This will be described later in detail.

Each of the plurality of subpixels SP may be defined as a minimum unit area in which light is actually emitted.

According to an example, three subpixels disposed to be adjacent to one another among the plurality of subpixels SP or three subpixels disposed to be adjacent to one another along a longitudinal direction of the data line (or gate line), and one transmissive area TA constitute one unit pixel. One unit pixel may include, but is not limited to, at least one red subpixel, at least one green subpixel, at least one blue subpixel, and at least one transmissive area TA. Each of the three subpixels SP may be disposed adjacent to one transmissive area TA.

According to another example, at least four subpixels disposed to be adjacent to one another among the plurality of subpixels SP or four subpixels disposed to be adjacent to one another along a longitudinal direction of the data line (or gate line), and one transmissive area TA constitute one unit pixel. One unit pixel may include, but is not limited to, a red subpixel, a green subpixel, a blue subpixel, a white subpixel, and the transmissive area TA. Each of the four subpixels SP may be disposed adjacent to one transmissive area TA.

Each of the plurality of subpixels SP includes a thin film transistor and a light emitting portion connected to the thin film transistor. The light emitting portion may include a light emitting element layer (or organic light emitting layer) interposed between a pixel electrode and a common electrode.

The light emitting element layers respectively disposed in the plurality of subpixels SP may individually emit light of their respective colors different from one another or commonly emit white light. According to an example, when the light emitting element layers of the plurality of subpixels SP commonly emit white light, each of the red subpixel, the green subpixel and the blue subpixel may include a color filter (or wavelength conversion member) for converting white light into light of its respective different color. In this case, the white subpixel according to an example may not include a color filter. At least a portion of the white subpixel according to another example may include the same color filter as any one of the red subpixel, the green subpixel and the blue subpixel.

Each of the subpixels SP supplies a predetermined current to the organic light emitting element in accordance with a data voltage of the data line when a gate signal is input from the gate line by using the thin film transistor. For this reason, the light emitting portion of each of the subpixels may emit light with a predetermined brightness in accordance with the predetermined current. A portion where light is emitted from each of subpixels may be the light emission area EA. Accordingly, the light emission area EA of each of subpixels may be disposed adjacent to the transmissive area TA. A structure of each of the subpixels SP will be described later with reference to FIG. 4.

A non-display unit IA may be an area in which an image is not displayed, and may be a peripheral circuit area, a signal supply area, a non-active area or a bezel area. The non-display unit IA may be provided in the periphery of the display unit AA. That is, the non-display unit IA may be disposed to surround the display unit AA. The non-display unit IA may include a plurality of pad portions PP connected to the plurality of pixels P disposed in the display unit AA. The plurality of pad portions PP may be spaced apart from each other along a first axial direction X. Each of the plurality of pad portions may include a plurality of data pads, at least one pixel driving power pad, and a plurality of common power pads.

The gate driver GD supplies gate signals to the gate lines in accordance with the gate control signal input from the timing controller 150. The gate driver GD may be formed on one side of the display unit AA of the display panel or on the non-display unit IA outside both sides of the display unit AA in a gate driver in panel (GIP) method as shown in FIG. 1. Alternatively, the gate driver GD may be manufactured as a driving chip, packaged in a flexible film and attached to the non-display unit IA outside one side or both sides of the display unit AA of the display panel by a tape automated bonding (TAB) method. The gate driver GD may include a plurality of gate driving circuits (or GIP circuit portions).

The source drive IC 120 receives digital video data and a source control signal from the timing controller 150. The source drive IC 120 converts the digital video data into analog data voltages in accordance with the source control signal and supplies the analog data voltages to the data lines. When the source drive IC 120 is manufactured as a driving chip, the source drive IC 120 may be packaged in the flexible film 130 in a chip on film (COF) method or a chip on plastic (COP) method.

Pads, such as data pads, may be formed in the non-display unit IA of the display panel. Lines connecting the pads with the source drive IC 120 and lines connecting the pads with lines of the circuit board 140 may be formed in the flexible film 130. The flexible film 130 may be attached onto the pads by using an anisotropic conducting film, whereby the pads may be connected with the lines of the flexible film 130.

The circuit board 140 may be attached to the flexible films 130. A plurality of circuits implemented as driving chips may be packaged in the circuit board 140. For example, the timing controller 150 may be packaged in the circuit board 140. The circuit board 140 may be a printed circuit board or a flexible printed circuit board.

The timing controller 150 receives the digital video data and a timing signal from an external system board through a cable of the circuit board 140. The timing controller 150 generates a gate control signal for controlling an operation timing of the gate driver GD and a source control signal for controlling the source drive ICs 120 based on the timing signal. The timing controller 150 supplies the gate control signal to the gate driver GD, and supplies the source control signal to the source drive ICs 120.

Referring to FIG. 1, the transmissive area TA may be disposed to be adjacent to a plurality of subpixels SP, and may be included in one pixel P. Since the plurality of pixels P are provided in the display unit AA, a plurality of transmissive areas TA may be provided in the display unit AA.

The display unit AA may include a transmissive area TA and a non-transmissive area except the transmissive area TA. The transmissive area TA is an area through which most of light incident from the outside passes, and the non-transmissive area is an area through which most of light incident from the outside does not transmit. For example, the transmissive area TA may have light transmittance of α %, for example, greater than 90%, and the non-transmissive area may be an area having light transmittance of β %, for example, smaller than 50%. At this time, α is a value greater than β. A user may view an object or background positioned on the rear surface of the display panel due to the transmissive areas TA. As shown in FIG. 1, in order to improve transmittance of the object or background positioned on the rear surface of the display panel, the transmissive area TA may not be provided with a planarization layer 113 and a bank 115.

Meanwhile, each of the subpixels SP supplies a predetermined current to an organic light emitting element according to a data voltage of the data line when a gate signal from the gate line is input using a thin film transistor. Therefore, a light emitting portion of each of the subpixels SP may emit light with predetermined brightness in accordance with the predetermined current.

Referring to FIGS. 1 and 4, each of the first to third subpixels SP1, SP2 and SP3 according to one example may include a circuit element layer 111 provided on an upper surface of a buffer layer BL, including a gate insulating layer 111a, an interlayer insulating layer 111b, a passivation layer 111c and a thin film transistor 112, a planarization layer 113 provided on the circuit element layer 111, a pixel electrode 114 provided on the planarization layer 113, a bank 115, an organic light emitting layer 116, a common electrode 117, and an encapsulation layer 118. The pixel electrode 114, the organic light emitting layer 116 and the common electrode 117 may be included in the light emitting element.

The buffer layer BL according to one example is provided on the substrate 110 to prevent water permeation to the thin film transistor 112. The buffer layer BL may be formed between the substrate 110 and the circuit element layer 111 (or gate insulating layer 111a) to protect the thin film transistor 112. The buffer layer BL may be disposed entirely on one surface (or front surface) of the substrate 110. The buffer layer BL may serve to prevent a material contained in the substrate 110 from diffusing into the transistor layer during a high temperature process of a manufacturing process of the thin film transistor.

The circuit element layer 111 may include a gate insulating layer 111a, an interlayer insulating layer 111b, a passivation layer 111c and a thin film transistor 112. The gate insulating layer 111a, the interlayer insulating layer 111b and the passivation layer 111c may be made of an inorganic material.

The thin film transistor 112 according to an example may include an active layer 112a, a gate electrode 112b, a source electrode 112c, and a drain electrode 112d.

The active layer 112a may include a channel area, a drain area and a source area, which are formed in a thin film transistor area of a circuit area of the pixel P. The drain area and the source area may be spaced apart from each other with the channel area interposed therebetween.

The active layer 112a may be formed of a semiconductor material based on any one of amorphous silicon, polycrystalline silicon, oxide and organic material.

The gate insulating layer 111a may be formed on the channel area of the active layer 112a. As an example, the gate insulating layer 111a may be formed in an island shape only on the channel area of the active layer 112a, or may be formed on an entire front surface of the first substrate 110 or the buffer layer BL, which includes the active layer 112a.

The gate electrode 112b may be formed on the gate insulating layer 111a to overlap the channel area of the active layer 112a.

The interlayer insulating layer 111b may be formed on the gate electrode 112b and the drain area and the source area of the active layer 112a. The interlayer insulating layer 111b may be formed in the circuit area and an entire light emission area, in which light is emitted to the pixel P. For example, the interlayer insulating layer 111b may be made of an inorganic material, but is not necessarily limited thereto.

The source electrode 112c may be electrically connected to the source area of the active layer 112a through a source contact hole provided in the interlayer insulating layer 111b overlapped with the source area of the active layer 112a.

The drain electrode 112d may be electrically connected to the drain area of the active layer 112a through a drain contact hole provided in the interlayer insulating layer 111b overlapped with the drain area of the active layer 112a.

The drain electrode 112d and the source electrode 112c may be made of the same metal material. For example, each of the drain electrode 112d and the source electrode 112c may be made of a single metal layer, a single layer of an alloy or a multi-layer of two or more layers, which is the same as or different from that of the gate electrode.

In addition, the circuit area may further include first and second switching thin film transistors disposed together with the thin film transistor 112, and a capacitor. Since each of the first and second switching thin film transistors is provided on the circuit area of the pixel P to have the same structure as that of the thin film transistor 112, its description will be omitted. The capacitor (not shown) may be provided in an overlap area between the gate electrode 112b and the source electrode 112c of the thin film transistor 112, which overlap each other with the interlayer insulating layer 111b interposed therebetween.

Additionally, in order to prevent a threshold voltage of the thin film transistor provided in a pixel area from being shifted by light, the display panel or the first substrate 110 may further include a light shielding layer (not shown) provided below the active layer 112a of at least one of the thin film transistor 112, the first switching thin film transistor or the second switching thin film transistor. The light shielding layer may be disposed between the substrate 110 and the active layer 112a to shield light incident on the active layer 112a through the substrate 110, thereby reducing or minimizing a change in the threshold voltage of the transistor due to external light.

The passivation layer 111c may be provided on the substrate 110 to cover the pixel area in which the pixel P is disposed. The passivation layer 111c covers the drain electrode 112d and the source electrode 112c of the thin film transistor 112 and the interlayer insulating layer 111b. The passivation layer 111c may be entirely formed in the circuit area and the light emission area.

The planarization layer 113 may be formed on the substrate 110 to cover the passivation layer 111c. The planarization layer 113 may be formed entirely in the circuit area and the light emission area.

The planarization layer 113 according to an example may be formed to be relatively thick, and thus may provide a flat surface on the display unit AA. For example, the planarization layer 113 may be made of an organic material such as photo acryl, benzocyclobutene, polyimide, and fluorine resin.

The planarization layer 113 according to one example may be formed to cover an edge portion of the substrate 110 and the circuit element layer 111 except the transmissive area TA. Therefore, the passivation layer 111c of the circuit element layer 111 disposed at the edge portion of the substrate 110 may be exposed without being covered by the planarization layer 113. In addition, since the planarization layer 113 is not disposed in the transmissive area TA, transmittance may be improved.

The light emitting element layer may be disposed on the planarization layer 113. The light emitting element layer according to one example may include a pixel electrode 114, an organic light emitting layer 116 and a common electrode 117.

The pixel electrode 114 may be expressed as an anode electrode, a reflective electrode, a lower electrode or a first electrode of the organic light emitting layer 116.

The pixel electrode 114 may be disposed on the planarization layer 113 that overlaps the light emission area EA of each pixel. The pixel electrode 114 may be patterned in an island shape to be disposed in each pixel, and may be electrically connected to source/drain electrodes 112c and 112d of a thin film transistor (or driving TFT) 112 of a corresponding pixel circuit. One side of the pixel electrode 114 may be extended onto the source/drain electrodes 112c and 112d of the thin film transistor 112, and may be electrically connected to the source/drain electrodes 112c and 112d of the thin film transistor 112 through a contact hole provided in the planarization layer 113.

The pixel electrode 114 according to one example may include a metal material having a low work function and excellent reflection efficiency.

As an example, when the transparent display apparatus 100 is provided in a top emission mode, the pixel electrode 114 may be formed of a metal material having high reflectance and a stacked structure of a metal material having high reflectance and a transparent metal material. For example, the pixel electrode 114 may have a stacked structure of a lower electrode and an upper electrode. The lower electrode may be disposed between a planarization layer 113 and the upper electrode, and may have a greater coupling force with the planarization layer than that with the upper electrode. The lower electrode according to one example may be provided in a stacked structure (ITO/MoTi/ITO) of MoTi and ITO to enhance the coupling force with the planarization layer 113. The upper electrode is disposed on an upper surface (or upper side) of the lower electrode, that is, between the lower electrode and the organic light emitting layer 116, and may be provided in a stacked structure (ITO/Ag/ITO) of Ag and ITO. The upper electrode may have higher reflectance, which reflects light emitted from the organic light emitting layer 116, than the lower electrode.

As shown in FIGS. 1 and 4, since the pixel electrode 114 is provided in the display unit AA, the planarization layer 113 may be provided below the pixel electrode 114 in the display unit AA. The planarization layer 113 is provided at a predetermined thickness to cover the thin film transistor 112 for allowing the organic light emitting layer 116 to emit light, so that an upper surface of the planarization layer 113 may be provided to be flat. Therefore, the pixel electrode 114 provided on the planarization layer 113 may be provided to be flat along a profile of the upper surface of the planarization layer 113.

The bank 115 may be disposed in a non-light emission area in which light is not emitted, and may be provided to surround each of the light emission areas EA of each of the plurality of subpixels. That is, the bank 115 may partition (or define) each of the light emission areas EA. The bank 115 may be formed to cover an edge of the pixel electrode 114, thereby partitioning (or defining) the light emission areas EA of each of the plurality of subpixels.

The bank 115 may be formed to cover the edge of each of the pixel electrodes 114 of each of the subpixels and expose a portion of each of the pixel electrodes 114. Therefore, the bank 115 may prevent a short from occurring between the pixel electrode 114 and the common electrode 117 at the edge of the pixel electrode 114. The exposed portion of the pixel electrode 114 that is not covered by the bank 115 may be the light emission area EA.

The bank 115 may be formed of an organic layer such as an acrylic resin, an epoxy resin, a phenolic resin, a polyamide resin and a polyimide resin, but is not limited thereto.

The organic light emitting layer 116 is formed on the pixel electrode 114 and the bank 115. When a voltage is applied to the pixel electrode 114 and the common electrode 117, holes and electrons move to the organic light emitting layer 116, respectively, and are combined with each other in the organic light emitting layer 116 to emit light.

The organic light emitting layer 116 may be formed of a common layer provided on the plurality of subpixels SP and the bank 115. In this case, the organic light emitting layer 116 may be provided in a tandem structure in which a plurality of light emitting layers, for example, a yellow green light emitting layer and a blue light emitting layer are stacked, and may emit white light when an electric field is formed between the pixel electrode 114 and the common electrode 117.

A color filter (not shown) suitable for a color of the corresponding subpixel may be formed in each of the plurality of subpixels. For example, a red color filter may be provided in a red subpixel, a green color filter may be provided in a green subpixel, and a blue color filter may be provided in a blue subpixel. The white subpixel may not be provided with a color filter because the organic light emitting layer 116 emits white light.

The common electrode 117 is formed on the organic light emitting layer 116. The common electrode 117 may be a second electrode or a cathode electrode. The common electrode 117 may be a common layer commonly formed in the subpixels. The common electrode 117 may be formed of a transparent metal material, a semi-transmissive metal material or a metal material having high reflectance.

When the transparent display apparatus 100 is provided in a top emission mode, the common electrode 117 may be formed of a transparent conductive material (TCO) such as ITO and IZO, which may transmit light, or a semi-transmissive conductive material such as magnesium (Mg), silver (Ag) or an alloy of magnesium (Mg) and silver (Ag).

The encapsulation layer 118 is formed on the common electrode 117. The encapsulation layer 118 serves to prevent oxygen or moisture from being permeated into the organic light emitting layer 116 and the common electrode 117. Accordingly, in some embodiments, the encapsulation layer 118 may include at least one inorganic layer and at least one organic layer.

The encapsulation layer 118 according to one example may include a first inorganic layer 118a provided on the common electrode 117 of the display unit AA, an organic layer 118b provided on the first inorganic layer 118a, and a second inorganic layer 118c provided on the organic layer 118b. The organic layer 118b may be provided at a thickness sufficient to cover foreign materials (not shown) such as particles that may occur when the light emitting element including the organic light emitting layer 116 is formed.

The organic layer 118b according to one example may be extended to a dam (not shown) provided in the non-display unit IA, as well as the display unit AA. The first inorganic layer 118a and the second inorganic layer 118c may be provided to be extended toward an end of the substrate 110 to cover the common electrode 117, which is provided to be extended from the display unit AA to the non-display unit IA, and the dam provided in the non-display unit IA.

Referring to FIG. 4, the reproducing plate 200 may be disposed in parallel with the substrate 110. For example, the reproducing plate 200 may be disposed in parallel with the substrate 110 to overlap the substrate 110 in a thickness direction of the substrate 110, that is, a third axial direction Z. Therefore, the reproducing plate 200 may reflect the light, which is emitted from the light emission area EA, reflected on a boundary surface between the organic layer 118b and the second inorganic layer 118c and emitted to the rear surface of the substrate 110 through the transmissive area TA, back to the transmissive area TA. Accordingly, in some embodiments, the reproducing plate 200 may include a plurality of reproducing portions 210 at least partially overlapped with the transmissive area TA. The light emitted from the light emission area EA may be reflected on a boundary surface between the second inorganic layer 118c and a second substrate 110' or a boundary surface between the second substrate 110' and the external air and then may be emitted toward the transmissive area TA. The plurality of reproducing portions 210 may be disposed on the rear surface of the substrate 110 to reflect light of the light emission area EA, which is emitted toward the transmissive area TA, that is, image light toward an optical path opposite to an optical path of incident light and emit the light toward the front surface of the substrate 110.

Referring to FIGS. 1 to 4, the plurality of reproducing portions 210 may overlap at least a portion of the transmissive area TA. For example, a portion of the plurality of reproducing portions 210 may overlap the transmissive area TA, and the other of the plurality of reproducing portions 210 may overlap the subpixel SP and the bank 115 positioned in the non-emission area in the third axial direction Z. The other of the plurality of reproducing portions 210 may overlap the light emission area EA, but the present disclosure is not limited thereto. All of the plurality of reproducing portions 210 may be provided to overlap only the transmissive area TA. The second axial direction Y is perpendicular to each of the first axial direction X and the third axial direction Z, and may refer to a vertical direction of the display panel.

The plurality of reproducing portions 210 may be disposed in the form of a circle or a circular orbit. For example, as shown in FIGS. 2 and 3, the plurality of reproducing portions 210 may be provided in the form of a circle or the circular orbit. The circle may be disposed at a position corresponding to a central portion of the transmissive area TA, and a plurality of the circular orbit may be disposed along a circumference that is larger in diameter than the circle. For example, the first reproducing area RA1 may be formed in the form of a circle, and first reproducing members 211 may be spaced apart from each other inside the circle. A second reproducing area RA2 may be formed in a circular shape (or circular orbit) having a diameter larger than that of the first reproducing area RA1 and second and third reproducing members 212 and 213 may be spaced apart from each other along the circle (or circle orbit) of the second reproducing area RA2. The third reproducing area RA3 may be formed of a circle (or circle orbit) having a diameter larger than that of the second reproducing area RA2, and the first, second and third reproducing members 211, 212 and 213 may be spaced apart from one another along the circle (or circle orbit) of the third reproducing area RA3. The first, second and third reproducing areas RA1, RA2 and RA3 may be provided in the form of concentric circles having different diameters.

The transparent display apparatus 100 according to one embodiment of the present disclosure includes a plurality of reproducing portions 210 in the form of circle (or circle orbit), so that incident light emitted from the organic light emitting layer may be reflected by being focused on a light emitting position (or location). This may be similar to focusing of light on a focal distance of a concave mirror when light is illuminated to the concave mirror. However, the concave mirror is provided with a reflective surface having a curvature so as to reflect light, whereas the plurality of reproducing portions 210 described herein are provided to be flat as shown in FIG. 3 and reflect light using diffraction and refraction characteristics of the light by adjusting a diameter and interval of each of the plurality of reproducing portions 210. In the transparent display apparatus 100 according to one embodiment of the present disclosure, the plurality of reproducing portions 210 are provided in the form of circles having different diameters and different intervals, so that the incident light, which is emitted from the organic light emitting layer and has different wavelength ranges, may be reflected by being focused on the light emitting position (or location) as shown in FIG. 4. Therefore, in the transparent display apparatus 100 according to one embodiment of the present disclosure, the light emitted toward the rear surface (or reproducing plate) through the transmissive area may be reflected toward the front surface (or light emission area), whereby luminance of the image may be improved.

Referring to FIGS. 1 to 4, the transmissive area TA may include a first transmissive area TA1 that is a central portion, a third transmissive area TA3 that is an edge portion, and a second transmissive area TA2 between the first transmissive area TA1 and the third transmissive area TA3. The reproducing plate 200 may include a first reproducing area RA1 overlapped with the first transmissive area TA1 in the third axial direction Z, a second reproducing area RA2 overlapped with the second transmissive area TA2 in the third axial direction Z, and a third reproducing area RA3 overlapped with the third transmissive area TA3 with the third axial direction Z. The plurality of reproducing portions 210 may include a plurality of first reproducing members 211 for reflecting red light, a plurality of second reproducing members 212 for reflecting green light, and a plurality of third reproducing members 213 for reflecting blue light. Only a portion of the plurality of first reproducing members 211 may be disposed in the first reproducing area RA1. A portion of each of the plurality of second reproducing members 212 and the plurality of third reproducing members 213 may be disposed in the second reproducing area RA2. A portion of each of the plurality of first reproducing members 211, the plurality of second reproducing members 212 and the plurality of third reproducing members 213 may be disposed in the third reproducing area RA3.

As shown in a right enlarged view of FIG. 2, a plurality of first sub-reproducing members 211a of the plurality of first reproducing members 211 may be disposed to be adjacent to each other at a predetermined interval in a circle (or first reproducing area RA1) corresponding to the first transmissive area TA1. In more detail, referring to FIGS. 2 and 3, the first reproducing members 211 of a cylindrical shape having a predetermined diameter may be disposed in a circular shape having a predetermined interval in the first reproducing area RA1. The plurality of second reproducing members 212 of a cylindrical shape having a diameter different from that of the first reproducing member 211 may be disposed in the second reproducing area RA2. The second reproducing members 212 may be spaced apart from the first reproducing members 211 at a predetermined distance to surround the first reproducing members 211. That is, the plurality of first reproducing members 211 and the plurality of second reproducing members 212 may be alternately disposed.

Referring to FIGS. 2 to 4, in the transparent display apparatus 100 according to one embodiment of the present disclosure, the plurality of first reproducing members 211, the plurality of second reproducing members 212 and the plurality of third reproducing members 213 may be alternately disposed. This is to determine a path (or direction) of the reflected light by spacing the first reproducing members 211 reflecting red light apart from each other as much as a predetermined interval, spacing the second reproducing members 212 reflecting green light as much as a predetermined interval and spacing the third reproducing member 213 reflecting blue light as much as a predetermined interval.

The reason why only the first reproducing member 211 is disposed in the first reproducing area RA1 is because luminance of the red light is insufficient as compared with that of the green light and the blue light. Therefore, the first reproducing member 211 is disposed in the first reproducing area RA1 disposed to overlap (or correspond to) the central portion of the transmissive area TA, which has the largest amount of incident light, so that luminance of the red light emitted to the front surface of the substrate 110 may be enhanced. As shown in FIGS. 2 and 4, a portion of the plurality of first reproducing members 211 may be disposed inside the circle that is the first reproducing area RA1.

As described above, since luminance of the red light is insufficient as compared with that of the green light and the blue light, a ratio of the first reproducing member 211 disposed in the first to third reproducing areas RA1, RA2 and RA3 corresponding to the transmissive area TA may be greater than that of the second and third reproducing members 212 and 213. For example, the plurality of first reproducing members 211, the plurality of second reproducing members 212 and the plurality of third reproducing members 213 may be provided at a ratio of 37.4:33.3:29.3.

Meanwhile, each of the plurality of reproducing portions 210 may reflect the light of the light emission area EA incident on the first path RL1 through the transmissive area TA toward the second path RL1-1 opposite to the first path RL1 by a difference in a refractive index between the base substrate 220 and the cover layer 230, which are adjacent to the plurality of reproducing portions 210, and diffraction of the adjacent reproducing portions 210. That is, the plurality of reproducing portions 210 may focus the light to the light emitting position (or location) where the light is emitted in the light emitting area EA and reflect incident light. Accordingly, in some embodiments, each of the plurality of reproducing portions 210 may be provided in a cylindrical shape having a predetermined diameter and a predetermined height, and may be disposed to be spaced apart from each other at a predetermined distance.

FIG. 5 is a schematic view illustrating only the first reproducing member 211, the second reproducing member 212 and the third reproducing member 213. Referring to FIG. 5, a height H of each of the plurality of reproducing portions 210 may be larger than a maximum visible light wavelength range. Since the visible light wavelength range is 380 nm to 780 nm, the maximum visible light wavelength range may be 780 nm. In the transparent display apparatus 100 according to one embodiment of the present disclosure, the height H of each of the plurality of reproducing portions 210 may be 1 μm or more. When the height of the reproducing portion 210 is less than 1 μm, it may belong to the visible wavelength range, and in this case, a diffraction interference phenomenon in the vertical direction may become serious, so that the second path RL1-1 may vary. When the height of the reproducing portion 210 is less than 1 μm, it may not shield the visible light, whereby the visible light may be transmitted without being reflected by the reproducing portion 210. Therefore, the transparent display apparatus 100 according to one embodiment of the present disclosure is provided such that the height of each of the plurality of reproducing portions 210 is greater than the maximum visible light wavelength range, thereby reflecting the light incident to the reproducing portion 210 while preventing the second path RL1-1 from being varied. That is, the height H of each of the plurality of reproducing portions 210 may be a factor for determining a path of light to be reflected. The plurality of reproducing portions 210 may include a plurality of first reproducing members 211, a plurality of second reproducing members 212, and a plurality of third reproducing members 213. Therefore, each of the plurality of first reproducing members 211, the plurality of second reproducing members 212 and the plurality of third reproducing members 213 may be larger than the maximum visible light wavelength range.

A diameter Ø of each of the plurality of reproducing portions 210 may be provided to satisfy the following equation:

$$\phi = ae\left(\frac{hc}{n_e\lambda_T}\right)^{\pi} + e^{2\pi} + 2\pi - \frac{hc}{\pi^2},$$

where "a" is an interference constant, "e" is an exponential function, "π" is a circumferential rate, "h" is a Planck's constant, "c" is velocity of light, "$n_e$" is an effective refractive index, and $\lambda_T$ denotes a wavelength. Since "a," "e," "π," "h," "c" and "$n_e$" are constants, the diameter Ø of each of the plurality of reproducing portions 210 may be determined depending on the wavelength $\lambda_T$. Therefore, the first reproducing members 211, the second reproducing members 212 and the third reproducing members 213 may be provided at different diameters to reflect light of different colors. For example, a diameter Ø2 of each of the second reproducing members 212 may be smaller than a diameter Ø1 of each of the first reproducing members 211, and may be larger than a diameter Ø3 of each of the third reproducing members 213. Therefore, in accordance with the above equation, the first reproducing members 211 may reflect the red light, the second reproducing members 212 may reflect the green light and the third reproducing members 213 may reflect the blue light. That is, the diameter Ø of each of the plurality of reproducing portions 210 may be a factor for determining the color (or wavelength) of the light that is reflected.

Referring to FIGS. 4 and 6, the interval between the respective reproducing portions 210 may be smaller than a minimum visible light wavelength range. In this case, an interval refers to an interval between the plurality of reproducing portions 210 disposed in each circle. For example, the interval may mean an internal distance RID between the first reproducing members 211 disposed in the first reproducing area RA1 in FIG. 6. Since the minimum visible light wavelength range is 380 nm, the internal distance between the plurality of reproducing portions 210 is smaller than 380 nm. The reason why that the internal distance RID between the plurality of reproducing portions 210 (or the plurality of the first reproducing members 211) is provided to be smaller than the minimum visible light wavelength range is to reflect the color (or wavelength) of the corresponding visible light. For example, when the internal distance between the plurality of reproducing portions is provided to exceed the minimum visible light wavelength range, the reproducing portion may reflect an ultraviolet wavelength range other than the visible light wavelength range. Therefore, the internal distance RID between the plurality of reproducing portions 210 may be smaller than the minimum visible light wavelength range. Meanwhile, when the internal distance between the reproducing portions 210 is too close, an infrared wavelength range may be reflected. Therefore, the transparent display apparatus 100 according to one embodiment of the present disclosure may be provided such that the internal distance between the plurality of reproducing portions 210 is smaller than the minimum visible light wavelength range within the range that does not reflect the infrared wavelength range.

An interval (or internal distance) GID (shown in FIG. 9) between the second reproducing members 212 according to one example may be smaller than the interval (or internal distance) RID between the first reproducing members 211 and smaller than an interval (or internal distance) BID (shown in FIG. 10) between the third reproducing members

213. Therefore, the first reproducing members 211 may reflect red light, the second reproducing members 212 may reflect green light, and the third reproducing members 213 may reflect blue light. For example, the internal distance RID between the first reproducing members 211 may be 95 nm. The internal distance GID between the second reproducing members 212 may be 100 nm. The internal distance BID between the third reproducing members 213 may be 115 nm. As a result, the diameter and internal distance of each of the plurality of reproducing portions 210 may be a decision factor for reflecting any one of the red light, the green light and the blue light.

FIG. 6 schematically illustrates a plurality of first sub-reproducing members 211a, a plurality of second sub-reproducing members 211b and a plurality of third sub-reproducing members 211c of the plurality of first reproducing members 211. The plurality of first sub-reproducing members 211a may be disposed in the first reproducing area RA1 to enhance luminance of the red light. The plurality of second sub-reproducing members 211b may be disposed in the third reproducing area RA3 adjacent to the second reproducing area RA2. Since the first reproducing member 211 is disposed in the first reproducing area RA1 corresponding to the central portion of the transmissive area TA, the first reproducing member 211 may not be disposed in the second reproducing area RA2 adjacent to the first reproducing area RA1.

As shown in FIGS. 4 and 6, the plurality of second sub-reproducing members 211b may be provided to surround the plurality of first sub-reproducing members 211a at a position spaced apart from the plurality of first sub-reproducing members 211a at a predetermined distance. For example, the plurality of second sub-reproducing members 211b may be spaced apart from each other at an external distance RED greater than the internal distance RID. As described above, the internal distance RID is a factor for determining the wavelength of the light reflected by the plurality of reproducing portions 210, that is, the color. On the other hand, the external distance RED is a factor for determining a direction of the light reflected by the plurality of reproducing portions 210. For example, the second sub-reproducing member 211b may reflect the red light from the light emission area EA to the light emitting position through constructive interference with the central portion of the reproducing area, that is, the first sub-reproducing member 211a positioned in the first reproducing area RA1.

In the transparent display apparatus 100 according to one embodiment of the present disclosure, the external distance RED may be greater than the maximum visible light wavelength range. For example, an external distance RED may be provided to exceed 1 μm. When the external distance is 1 μm or less, constructive interference with the adjacent first reproducing members 211 may become too large to change the direction of the reflected light. Meanwhile, when the external distance is too large, constructive interference with the adjacent first reproducing members 211 hardly occurs and thus the light may not be reflected to the light emitting position. Therefore, the transparent display apparatus 100 according to one embodiment of the present disclosure may be provided such that the external distance of the plurality of reproducing portions 210 is larger than the maximum visible light wavelength range within the range that the image light may be reflected by a second path opposite to the first path on which the image light is incident through the transmissive area TA.

Meanwhile, the reproducing plate 200 may further include a fourth reproducing area RA4 that does not overlap the transmissive area TA. A portion of the first reproducing members 211, the second reproducing members 212 and the third reproducing members 213 may be disposed in the fourth reproducing area RA4. The first reproducing members 211, the second reproducing members 212 and the third reproducing members 213, which are disposed in the fourth reproducing area RA4, may overlap the planarization layer 113 and/or the bank 115, which are/is disposed in the non-light emission area, in the third axis direction Z.

The plurality of first reproducing members 211 may further include a third sub-reproducing member 211c. The third sub-reproducing member 211c according to one example may be disposed in the fourth reproducing area RA4 to surround the plurality of second sub-reproducing members 211b. The plurality of third sub-reproducing members 211c may be spaced apart from the plurality of second sub-reproducing members 211b at the external distance RED greater than the internal distance RID. The plurality of second sub-reproducing members 211b may be spaced apart from the plurality of first sub-reproducing members 211a at a first external distance RED1, and the plurality of third sub-reproducing members 211c may be spaced apart from the plurality of second sub-reproducing members 211b at a second external distance RED2. In this case, the second external distance RED2 may be greater than the first external distance RED1. This is because that the number of the reproducing members 210 is reduced toward the fourth reproducing area RA4 from the first reproducing area RA1 as shown in FIG. 4.

Referring back to FIG. 4, the light incident on the fourth reproducing area RA4 may not be reflected by the reproducing members 210 and may be extinguished by being wave-guided by the reproducing members 210 on the substrate 110. However, the first reproducing members 211, the second reproducing members 212 and the third reproducing members 213, which are disposed in the fourth reproducing area RA4, may contribute to formation of the optical path of light reflected by the first, second and third reproducing members 211, 212 and 213 disposed in the first to third reproducing areas RA1, RA2 and RA3 through diffraction (constructive interference or extinction).

Meanwhile, as shown in FIG. 4, the light, which is emitted from the light emission area EA and incident on the first path RL1 toward the first sub-reproducing members 211a through the transmissive area TA, may be reflected through the second path RL1-1 opposite to the first path RL1. The light, which is emitted from the light emission area EA and incident on a first path RL2 toward the second sub-reproducing member 211b through the transmissive area TA, may be reflected to a second path RL2-1 opposite to the first path RL2. The light emitted from the light emission area EA and incident on a first path RL3 toward the third sub-reproducing member 211c through the transmissive area TA may be wave-guided and extinguished.

FIG. 7 is a schematic view illustrating that only the second sub-reproducing member 211b and the third sub-reproducing member 211c are disposed in the third and fourth reproducing areas RA3 and RA4, respectively, in order to describe diffraction (or constructive interference and extinction) by the plurality of reproducing portions 210. Referring to FIG. 7, the light incident on the third reproducing area RA3 from the transmissive area TA may be reflected by the second sub-reproducing members 211b and diffracted in the form of a wave. The light incident on the fourth reproducing area RA4 from the transmissive area TA may be reflected by the third sub-reproducing members 211c and diffracted in the form of a wave. As shown in FIG. 7, the waves diffracted by the second sub-reproducing member 211b and the third sub-reproducing member 211c may overlap each other, and constructive interference may occur in the overlap portion, whereby light having a diagonal path VL may be formed as shown in FIG. 7. The light of the diagonal path VL affects the third reproducing area RA3, resulting in the formation of the second path RL2-1.

Meanwhile, the second sub-reproducing member 211b and the third sub-reproducing member 211c may be disposed to be spaced apart from each other at the second external distance RED2. Since the sub-reproducing member capable of reflecting red light is not disposed within the second external distance RED2, diffraction cannot be generated, and thus the number (or amount) of waves that are overlapped is small. Therefore, constructive interference hardly occurs between the second sub-reproducing member 211b and the third sub-reproducing member 211c and thus light having a vertical path EL is extinguished, whereby the second sub-reproducing member 211b and the third sub-reproducing member 211c cannot contribute to the change of the optical path. As a result, in the transparent display apparatus 100 according to one embodiment of the present disclosure, a final path of light reflected by the reproducing portions 210 may be determined by an influence of constructive interference and extinction which are diffraction characteristics of the light.

FIG. 8 is a schematic view illustrating only the first sub-reproducing member 211a disposed in the first reproducing area RA1 and the third sub-reproducing members 211c disposed in the fourth reproducing area RA4.

The light RL3 incident on the fourth reproducing area RA4 is incident on a path exceeding a threshold angle, which may be reflected by the third sub-reproducing member 211c, and thus may not be reflected by the third sub-reproducing member 211c as shown in FIG. 8. Therefore, the light incident on a third path RL3 toward the fourth reproducing area RA4 may be extinguished by being wave-guided to the upper surface of the third sub-reproducing member 211c and the upper surface of the base substrate 220.

Next, light incident on the first path RL1 toward the first reproducing area RA1 may be reflected inside the first sub-reproducing member 211a by a difference in a refractive index n1 of the base substrate 220, a refractive index n2 of the first sub-reproducing member 211a and a refractive index n3 of the cover layer 230, and then may be reflected by the second path RL1-1. This reflection may be accomplished by the Snell's law that a ratio of a sign value of an incident angle and a sign value of a refractive angle is always constant when the wave moves from one medium to another medium. The refractive index n1 of the base substrate 220 may be larger than the refractive index n3 of the cover layer 230 and smaller than the refractive index n2 of each of the plurality of reproducing portions 210. For example, the refractive index n1 of the base substrate 220 may be 1.7 to 1.8, the refractive index n3 of the cover layer 230 may be 1.4 to 1.5, and the refractive index n2 of each of the plurality of reproducing portions 210 may be 2.

In the transparent display apparatus 100 according to one embodiment of the present disclosure, the image light incident on the first path RL1 from the transmissive area TA may be reflected to the second path RL1-1 opposite to the first path RL1 using the difference in the refractive index among the base substrate 220, the cover layer 230 and the plurality of reproducing portions 210 as shown in FIG. 8. In this case, the second path RL1-1 may mean a final path in which constructive interference with the adjacent reproducing portions 210 and extinction are combined. As a result, in the transparent display apparatus 100 according to one embodiment of the present disclosure, a return reflection path may be determined through the plurality of reproducing portions 210 having a predetermined diameter and height and the interval between the plurality of reproducing portions 210 to reflect the corresponding color. The return reflection path may be made through the difference in the refractive index among the base substrate 220, the cover layer 230 and the plurality of reproducing portions 210 and constructive interference and extinction of the light diffracted by the plurality of reproducing portions 210. Since the light reflected by the plurality of reproducing portions 210 may be emitted to the front surface of the substrate 110, luminance of the image may be improved by combining the light reflected by the plurality of reproducing portions 210 with the light emitted from the light emission area EA and emitted to the front surface, whereby visibility of the user with respect to the image may be improved.

Referring to FIG. 5, a height CH of the cover layer 230 may be at least 1.5 times to twice of the height H of the plurality of reproducing portions 210. The cover layer 230 according to one example may be made of an organic material similar to that of the planarization layer 113. Since the organic material has an absorption coefficient, when its thickness is too thin to be less than 1.5 times, a light absorption rate may be lowered to increase constructive interference. When the reinforcing interference is increased, a direction of the reflected light may vary. On the contrary, when a thickness of the cover layer 230 is too thick by exceeding twice, the light absorption rate may be increased to reduce the amount of the reflected light, whereby the image may be seen to be blurred. Therefore, in the transparent display apparatus 100 according to one embodiment of the present disclosure, the height CH of the cover layer is 1.5 times to twice of the height H of the plurality of reproducing portions 210, thereby reflecting the light to an optical path opposite to an optical path of the incident light and preventing the image from being seen to be blurred.

Referring back to FIG. 4, in the transparent display apparatus 100 according to one embodiment of the present disclosure, the reproducing plate 200 may be disposed to be spaced apart from the substrate 110 at a predetermined distance D. When visibility of the image light is lowered, that is, in a non-transmissive mode in which external light is not transmitted, the reproducing plate 200 may be disposed on the rear surface of the display panel. In a transmissive mode in which external light transmits the display panel, the reproducing plate 200 may not be disposed on the rear surface of the display panel. Therefore, the reproducing plate 200 may be disposed to overlap the rear surface of the substrate 110 in the non-transmissive mode and the transmissive mode, selectively. As a result, the reproducing plate 200 may be provided movably with respect to the substrate 110, so that the reproducing plate 200 may be spaced apart from the substrate 110 at a predetermined distance D to avoid damage due to friction with the substrate 110.

The reproducing plate 200 according to one example may be disposed at 10 μm or less from the rear surface of the substrate 110. When the reproducing plate 200 is disposed to exceed 10 μm from the rear surface of the substrate 110, a distance between the rear surface of the substrate 110 and the plurality of reproducing portions 210 is increased, so that reflectance by the reproducing portions 210 may be reduced. In addition, directionality of the light reflected by the reproducing portions 210 may vary. Therefore, in the transparent display apparatus 100 according to one embodiment of the present disclosure, the reproducing plate 200 is provided to be disposed at 10 μm or less from the rear surface of the substrate 110 within the range that friction between the reproducing plate 200 and the substrate 110 does not occur, so that reflectance by the reproducing portions 210 may be prevented from being deteriorated and the path of the reflected light may be prevented from being changed.

In the transparent display apparatus 100 according to one embodiment of the present disclosure, the reproducing plate 200 may be moved to overlap the rear surface of the substrate 110 during the non-transmissive mode, and the reproducing plate 200 may be moved so as not to overlap the rear surface of the substrate 110 during the transmissive mode, so that a behavior of spreading a black film may be omitted, whereby the switching time between the transmissive mode and the non-transmissive mode may be shortened.

In addition, the transparent display apparatus 100 according to one embodiment of the present disclosure is provided such that the reproducing plate 200 is disposed on the rear surface of the substrate 110 during the non-transmissive mode, thereby reducing the manufacturing cost as compared with the case where the transmissive area is switched to be opaque in the display panel.

Meanwhile, each of the plurality of reproducing portions 210 of the reproducing plate 200 may be made of a material having a refractive index higher than that of each of the base substrate 220 and the cover layer 230 to reflect light to the second path. Each of the reproducing portions 210 according to one example may be made of TiX, but is not limited thereto. Each of the reproducing portions 210 may be made of another material as long as the image light may be reflected to the second path opposite to the first path at which the image light is incident.

The base substrate 220 supporting the plurality of reproducing portions 210 may have low light transmittance to prevent external light from being transmitted through the transmissive area TA. The base substrate 220 according to one example may include a black-based material. Therefore, the external light incident on the rear surface of the substrate 110 is covered by the base substrate 220 containing the black material so that the external light cannot be incident on the transmissive area TA of the substrate 110. Therefore, the transparent display apparatus 100 according to one embodiment of the present disclosure may improve luminance of the image light emitted to the front surface of the substrate 110 while preventing the external light from being incident through the transmissive area TA, thereby increasing or maximizing visibility of the user with respect to the image light.

Figure 9:
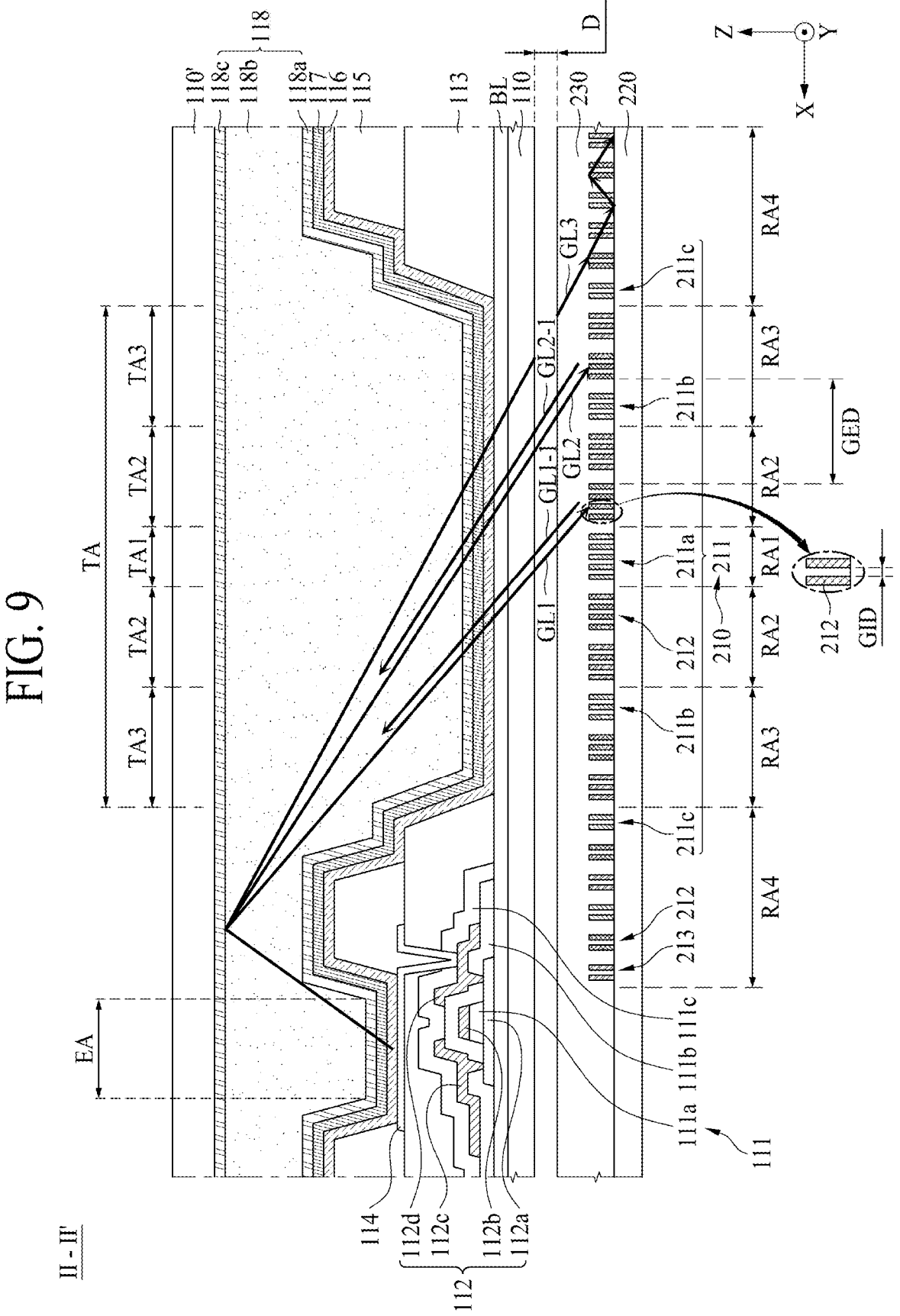
FIG. 9 is a schematic cross-sectional view taken along line II-II' shown in FIG. 1, illustrating an optical path of a second reproducing member.

FIG. 9 is a schematic cross-sectional view taken along line II-II' shown in FIG. 1, illustrating an optical path of a second reproducing member.

Referring to FIG. 9, the plurality of second reproducing members 212 may be disposed in the second reproducing area RA2, the third reproducing area RA3 and the fourth reproducing area RA4. The second reproducing members 212 disposed in the second to fourth reproducing areas RA2, RA3 and RA4 may be disposed to have a predetermined internal distance GID. The internal distance GID of the second reproducing members 212 according to one example may be smaller than the minimum visible light wavelength range. This is to reflect green (or green wavelength). For example, when the internal distance between the second reproducing members 212 is greater than the minimum visible light wavelength range, the second reproducing members 212 may reflect an ultraviolet wavelength range instead of the visible light wavelength range. Therefore, the internal distance RID between the plurality of second reproducing members 212 may be smaller than the minimum visible light wavelength range. Meanwhile, when the internal distance between the second reproducing members 212 is too close, the infrared wavelength range may be reflected. Therefore, in the transparent display apparatus 100 according to one embodiment of the present disclosure, the internal distance GID between the plurality of second reproducing members 212 may be smaller than the minimum visible light wavelength range, and may be provided within the range that does not reflect the infrared wavelength range.

Meanwhile, the second reproducing members 212 disposed in the second to fourth reproducing areas RA2, RA3 and RA4 may be disposed to have a predetermined external distance GED. This is because that the external distance GED is a factor for determining the direction of the light reflected by the plurality of second reproducing members 212. For example, the second reproducing members 212 disposed in the third reproducing area RA3 may reflect the green light so that the light returns to the position emitted from the light emission area EA through constructive interference with the second reproducing member 212 positioned in the second reproducing area RA2. Therefore, as shown in FIG. 9, light incident on first paths GL1 and GL2 toward the second reproducing members 212 from the transmissive area TA may be reflected to second paths GL1-1 and GL2-1 opposite to the first paths GL1 and GL2. A portion of the light reflected (or returning) to the second paths GL1-1 and GL2-1 by the second reproducing members 212 may be emitted through the second substrate 110', and the other portion of the light may be reflected on the boundary surface of the encapsulation layer 118 or the lower surface of the second substrate 110' and then reflected toward the pixel electrode 114. The light incident on the pixel electrode 114 may be reflected by the pixel electrode 114 and emitted to the second substrate 110'. As a result, the light reflected by the second reproducing members 212 may be combined with the light emitted from the light emission area EA and directly emitted to the second substrate 110' to improve visibility of the user with respect to the image light.

As shown in FIG. 9, the light incident on a third path GL3 toward the fourth reproducing area RA4 may not be reflected by the second reproducing members 212 because the light is incident by exceeding the threshold angle that may be reflected by the second reproducing member 212. Therefore, the light incident on the fourth reproducing area RA4 may be extinguished by being wave-guided to the upper surface of the second reproducing member 212 and the upper surface of the base substrate 220.

As a result, a return reflection path of the green light incident on the plurality of second reproducing members 212 from the transmissive area TA may be determined by the plurality of second reproducing members 212 having a predetermined diameter and height and the interval between the plurality of second reproducing members 212. This return reflection path may be made through a difference in a refractive index among the base substrate 220, the cover layer 230 and the plurality of second reproducing members 212 and constructive interference and extinction of the light diffracted by the plurality of second reproducing members 212. Since the difference in the refractive index among the plurality of second reproducing members 212, the base substrate 220 and the cover layer 230 and constructive interference and extinction due to diffraction of light are as described in the plurality of first reproducing members 211, their detailed description will be omitted.

Figure 10:
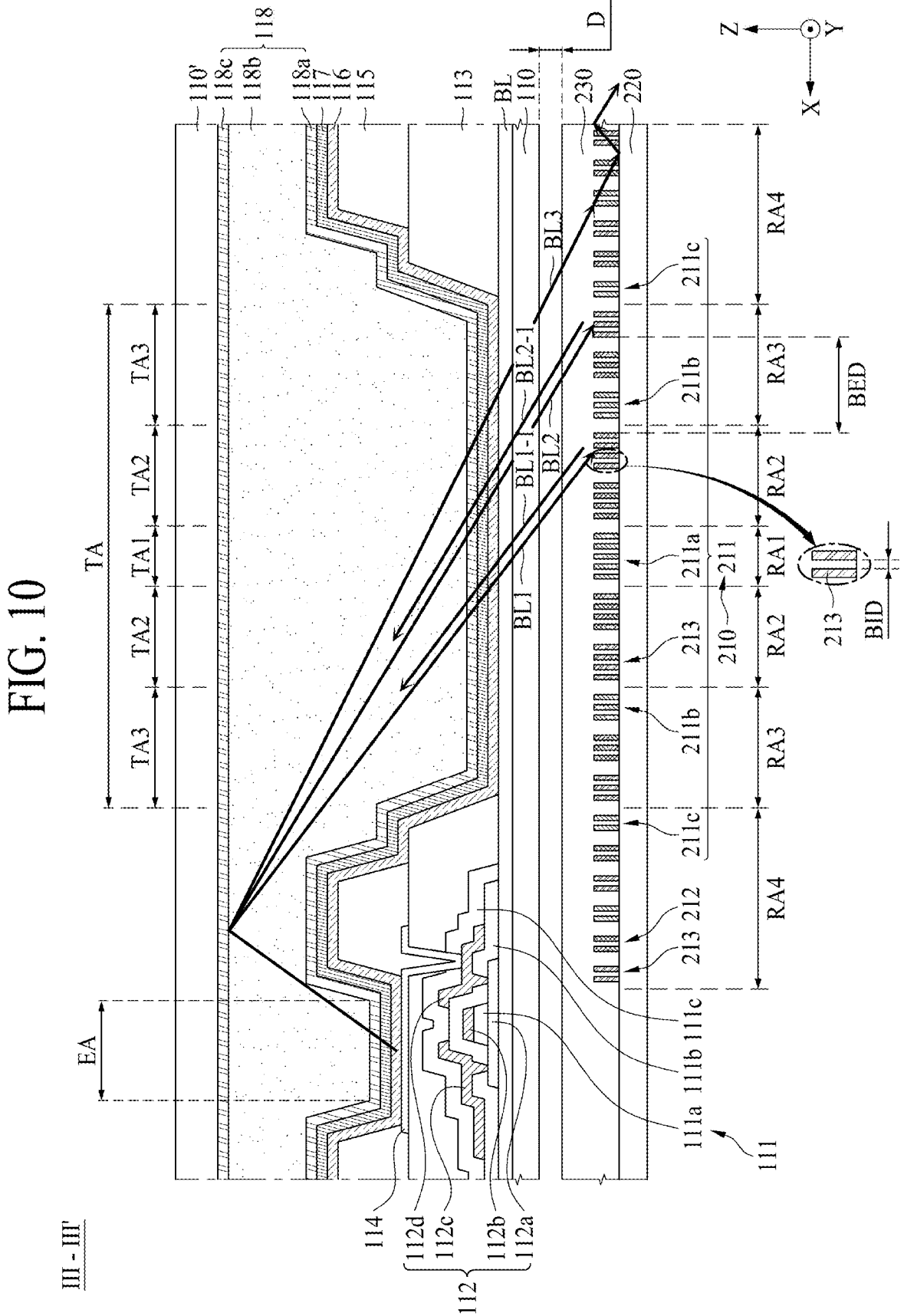
FIG. 10 is a schematic cross-sectional view taken along line III-III' shown in FIG. 1, illustrating an optical path of a third reproducing member.

FIG. 10 is a schematic cross-sectional view taken along line shown in FIG. 1, illustrating an optical path of a third reproducing member.

Referring to FIG. 10, the plurality of third reproducing members 213 may be disposed in the second reproducing area RA2, the third reproducing area RA3 and the fourth reproducing area RA4. The third reproducing members 213 disposed in the second to fourth reproducing areas RA2, RA3 and RA4 may be disposed to have a predetermined internal distance BID. The internal distance BID of the third reproducing members 213 according to one example may be smaller than the minimum visible light wavelength range. This is to reflect blue (or blue wavelength). For example, when the internal distance between the third reproducing members 213 is greater than the minimum visible light wavelength range, the third reproducing members 213 may reflect an ultraviolet wavelength range instead of the visible light wavelength range. Therefore, the internal distance BID between the plurality of third reproducing members 213 may be smaller than the minimum visible light wavelength range. Meanwhile, when the internal distance between the third reproducing members 213 is too close, the infrared wavelength range may be reflected. Therefore, in the transparent display apparatus 100 according to one embodiment of the present disclosure, the internal distance BID between the plurality of third reproducing members 213 may be smaller than the minimum visible light wavelength range, and may be provided within the range that does not reflect the infrared wavelength range.

Meanwhile, the third reproducing members 213 disposed in the second to fourth reproducing areas RA2, RA3 and RA4 may be disposed to have a predetermined external distance BED. This is because that the external distance BED is a factor for determining the direction of the light reflected by the plurality of third reproducing members 213. For example, the third reproducing members 213 disposed in the third reproducing area RA3 may reflect the blue light so that the light returns to the position emitted from the light emission area EA through constructive interference with the third reproducing member 213 positioned in the second reproducing area RA2. Therefore, as shown in FIG. 10, light incident on first paths BL1 and BL2 toward the third reproducing members 213 from the transmissive area TA may be reflected to second paths BL1-1 and BL2-1 opposite to the first paths BL1 and BL2. A portion of the light reflected (or returning) to the second paths BL1-1 and BL2-1 by the third reproducing members 213 may be emitted through the second substrate 110', and the other portion of the light may be reflected on the boundary surface of the encapsulation layer 118 or the lower surface of the second substrate 110' and then reflected toward the pixel electrode 114. The light incident on the pixel electrode 114 may be reflected by the pixel electrode 114 and emitted to the second substrate 110'. As a result, the light reflected by the third reproducing members 213 may be combined with the light emitted from the light emission area EA and directly emitted to the second substrate 110' to improve visibility of the user with respect to the image light.

As shown in FIG. 10, the light incident on a third path BL3 toward the fourth reproducing area RA4 may not be reflected by the second reproducing members 212 because the light is incident by exceeding the threshold angle that may be reflected by the third reproducing member 213. Therefore, the light incident on the fourth reproducing area RA4 may be extinguished by being wave-guided to the upper surface of the third reproducing member 213 and the upper surface of the base substrate 220.

As a result, a return reflection path of the blue light incident on the plurality of third reproducing members 213 from the transmissive area TA may be determined by the plurality of third reproducing members 213 having a predetermined diameter and height and the interval between the plurality of third reproducing members 213. This return reflection path may be made through a difference in a refractive index among the base substrate 220, the cover layer 230 and the plurality of third reproducing members 213 and constructive interference and extinction of the light diffracted by the plurality of third reproducing members 213. Since the difference in the refractive index among the plurality of third reproducing members 213, the base substrate 220 and the cover layer 230 and constructive interference and extinction due to diffraction of light are as described in the plurality of first reproducing members 211, their detailed description will be omitted.

Although the organic light emitting layer 116 has a structure in which the organic light emitting layer 116 is commonly provided in the plurality of subpixels SP to emit white light, the organic light emitting layer 116 is not limited thereto, and the plurality of subpixels SP may be provided to emit light of different colors. When the plurality of subpixels SP are provided to emit light of different colors, only a plurality of reproducing portions 210, which may reflect light of a corresponding color, may be disposed in the reproducing plate 200 that overlaps the transmissive area TA. For example, only the first reproducing members 211 may be disposed in the reproducing plate 200 overlapped with the transmissive area TA adjacent to the red subpixel SP, only the second reproducing members 212 may be disposed in the reproducing plate 200 overlapped with the transmissive area TA adjacent to the green subpixel SP, and only the third reproducing members 213 may be disposed in the reproducing plate 200 overlapped with the transmissive area TA adjacent to the blue subpixel SP, but the first to third reproducing members are not limited thereto. The first to third reproducing members 211, 212 and 213 of the same shape may be disposed in the reproducing plate 200 overlapped with the transmissive area TA adjacent to each of the red, green and blue subpixels SP to simplify the manufacture.

According to the present disclosure, the following advantageous effects may be obtained.

In the present disclosure, the reproducing plate is disposed at the position corresponding to the transmissive area, so that the external light is covered by the reproducing plate to fail to pass through the transmissive area, whereby visibility of a user with respect to an image may be improved.

Also, since the plurality of reproducing portions are disposed at the position corresponding to the transmissive area, the light emitted toward the rear surface (or reproducing plate) may be reflected toward the front surface (or light emission area) through the transmissive area, whereby luminance of the image may be improved.

Also, in the present disclosure, the reproducing plate is selectively disposed on the rear surface of the substrate, so that the switching time between the transmissive mode and the non-transmissive mode by shortened.

Also, in the present disclosure, the reproducing plate is selectively disposed on the rear surface of the substrate, so that the manufacturing cost may be reduced as compared with the case where the transmissive area is electrically converted into black.

It will be apparent to those skilled in the art that the present disclosure described above is not limited by the above-described embodiments and the accompanying drawings and that various substitutions, modifications and variations may be formed in the present disclosure without departing from the spirit or scope of the disclosures. Consequently, the scope of the present disclosure is intended to cover all variations or modifications derived from the meaning, scope and equivalent concept of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display apparatus comprising:
a substrate including a plurality of pixels, each pixel having a light emission area and a transmissive area; and
a reproducing plate disposed in parallel with the substrate, the reproducing plate including a plurality of reproducing portions at least partially overlapped with the transmissive area,
wherein the plurality of reproducing portions include:
a plurality of first reproducing members;
a plurality of second reproducing members; and
a plurality of third reproducing members,
wherein a diameter of each of the second reproducing members is smaller than a diameter of each of the first reproducing members and is larger than a diameter of each of the third reproducing members.

2. The transparent display apparatus of claim 1, wherein the plurality of reproducing portions reflect light, which is emitted from the light emission area and incident to a first path through the transmissive area, to a second path opposite to the first path.

3. The transparent display apparatus of claim 1, wherein a height of each of the plurality of reproducing portions is greater than a maximum visible light wavelength range.

4. The transparent display apparatus of claim 1, wherein an interval between the respective reproducing portions is smaller than a minimum visible light wavelength range.

5. The transparent display apparatus of claim 1, wherein a diameter of each of the plurality of reproducing portions satisfies $$\phi = ae\left(\frac{hc}{n_e\lambda_T}\right)^{\pi} + e^{2\pi} + 2\pi - \frac{hc}{\pi^2},$$

where "a" is an interference constant, "e" is an exponential function, "$\pi$" is a circumferential rate, "h" is a Planck's constant, "c" is velocity of light, "$n_e$" is an effective refractive index, and $\lambda_T$ is a wavelength.

6. The transparent display apparatus of claim 1, wherein the plurality of first reproducing members reflect red light; the plurality of second reproducing members reflect green light; and the plurality of third reproducing members reflect blue light.

7. The transparent display apparatus of claim 1, wherein a ratio of the plurality of first reproducing members to the transmissive area is greater than a ratio of the plurality of second reproducing members to the transmissive area and a ratio of the plurality of third reproducing members to the transmissive area.

8. The transparent display apparatus of claim 1, wherein an interval between the second reproducing members is larger than an interval between the first reproducing members and is smaller than an interval between the third reproducing members.

9. The transparent display apparatus of claim 1, wherein a portion of the plurality of first reproducing members is disposed to overlap a central portion of the transmissive area.

10. The transparent display apparatus of claim 1, wherein the transmissive area includes a first transmissive area that is a central portion, a third transmissive area that is an edge portion, and a second transmissive area between the first transmissive area and the third transmissive area, wherein the reproducing plate includes a first reproducing area overlapped with the first transmissive area, a second reproducing area overlapped with the second transmissive area, and a third reproducing area overlapped with the third transmissive area, wherein the first reproducing members include a plurality of first sub-reproducing members disposed in the first reproducing area and a plurality of second sub-reproducing members disposed in the third reproducing area, and wherein the plurality of second sub-reproducing members surround the plurality of first sub-reproducing members.

11. The transparent display apparatus of claim 10, wherein the respective first sub-reproducing members are spaced apart from each other at an internal distance, and wherein the plurality of first sub-reproducing members and the plurality of second sub-reproducing members are spaced apart from each other at a first external distance greater than the internal distance.

12. The transparent display apparatus of claim 11, wherein the reproducing plate includes a fourth reproducing area that does not overlap the transmissive area, wherein the first reproducing members include a plurality of third sub-reproducing members disposed in the fourth reproducing area, surrounding the plurality of second sub-reproducing members, wherein the plurality of third sub-reproducing members are spaced apart from the plurality of second sub-reproducing members at a second external distance, and wherein the first external distance is greater than the second external distance.

13. The transparent display apparatus of claim 10, wherein the reproducing plate includes a fourth reproducing area that does not overlap the transmissive area, and wherein at least a portion of each of the first reproducing members, the second reproducing members, and the third reproducing members is disposed in the fourth reproducing area.

14. The transparent display apparatus of claim 1, wherein the reproducing plate is disposed at 10 μm or less from the substrate.

15. The transparent display apparatus of claim 1, wherein the reproducing plate includes:

a base substrate on which the plurality of reproducing portions are disposed; and a cover layer covering the base substrate and the plurality of reproducing portions, and a refractive index of the base substrate is greater than a refractive index of the cover layer and is smaller than a refractive index of each of the plurality of reproducing portions.

16. The transparent display apparatus of claim 15, wherein a height of the cover layer is 1.5 times to twice of a height of the plurality of reproducing portions.

17. The transparent display apparatus of claim 1, wherein the plurality of reproducing portions are disposed in the form of a circle or a circular orbit.

18. A transparent display apparatus comprising:

a substrate including a plurality of pixels, each pixel having a light emission area and a transmissive area; and a reproducing plate reflecting light emitted from the light emission area and incident through the transmissive area, wherein the reproducing plate includes:

a plurality of first reproducing members reflecting red light incident through the transmissive area;

a plurality of second reproducing members reflecting green light incident through the transmissive area; and a plurality of third reproducing members reflecting blue light incident through the transmissive area, and wherein the plurality of first reproducing members, the plurality of second reproducing members, and the plurality of third reproducing members are alternately disposed, wherein a diameter of each of the second reproducing members is smaller than a diameter of each of the first reproducing members and is larger than a diameter of each of the third reproducing members.

19. The transparent display apparatus of claim 18, wherein each of the plurality of first reproducing members, the plurality of second reproducing members and the plurality of third reproducing members reflects light, which is emitted from the light emission area and incident to a first path through the transmissive area, to a second path opposite to the first path.

20. The transparent display apparatus of claim 18, wherein a height of each of the plurality of first reproducing members, the plurality of second reproducing members and the plurality of third reproducing members is greater than a maximum visible light wavelength range.

21. The transparent display apparatus of claim 18, wherein an interval of each of the plurality of first reproducing members, the plurality of second reproducing members and the plurality of third reproducing members is smaller than a minimum visible light wavelength range.

22. The transparent display apparatus of claim 21, wherein an interval between the second reproducing members is larger than an interval between the first reproducing members and is smaller than an interval between the third reproducing members.

23. The transparent display apparatus of claim 18, wherein a portion of the plurality of first reproducing members is disposed to overlap a central portion of the transmissive area.

24. The transparent display apparatus of claim 18, wherein the plurality of first reproducing members, the plurality of second reproducing members and the plurality of third reproducing members are disposed in the form of a circle or a circular orbit.

* * * * *